(12) United States Patent
Nakatani et al.

(10) Patent No.: US 10,659,043 B2
(45) Date of Patent: May 19, 2020

(54) PROXIMITY SENSOR

(71) Applicant: Hitachi Metals, Ltd., Tokyo (JP)

(72) Inventors: Katsutoshi Nakatani, Tokyo (JP); Kenji Ajima, Tokyo (JP); Katsuya Akimoto, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 122 days.

(21) Appl. No.: 15/926,086

(22) Filed: Mar. 20, 2018

(65) Prior Publication Data
US 2018/0316348 A1 Nov. 1, 2018

(30) Foreign Application Priority Data

Apr. 26, 2017 (JP) ................... 2017-086975

(51) Int. Cl.
*H03K 17/955* (2006.01)
*G01D 5/24* (2006.01)
*H03K 17/96* (2006.01)

(52) U.S. Cl.
CPC ............ *H03K 17/955* (2013.01); *G01D 5/24* (2013.01); *H03K 2017/9602* (2013.01); *H03K 2217/96071* (2013.01); *H03K 2217/960745* (2013.01); *H03K 2217/960765* (2013.01)

(58) Field of Classification Search
CPC ........... E05F 15/42; E05F 15/44; E05F 15/46; G01D 5/24; G01D 5/2417; G01D 11/245; H03K 17/955; H03K 17/962; H03K 2217/9602; H03K 2217/96071; H03K 2217/96078; H03K 2217/960745; H03K 2217/690765; H03K 17/945; B60R 21/01516; B60R 21/01532

USPC .... 324/207.11, 207.22, 207.24, 207.26, 661, 324/686, 688
See application file for complete search history.

(56) References Cited

U.S. PATENT DOCUMENTS

| 7,545,153 | B2 | 6/2009 | Abe | |
|---|---|---|---|---|
| 10,060,172 | B2 * | 8/2018 | Schatz | ..................... E05F 15/42 |
| 2006/0250142 | A1 * | 11/2006 | Abe | ..................... H03K 17/955 324/663 |
| 2007/0089527 | A1 * | 4/2007 | Shank | ..................... B60N 2/002 73/780 |
| 2012/0112767 | A1 * | 5/2012 | Nonogaki | ............ H03K 17/955 324/633 |

(Continued)

FOREIGN PATENT DOCUMENTS

JP 4578980 B2 11/2010

*Primary Examiner* — Steven L Yeninas
(74) *Attorney, Agent, or Firm* — Scully, Scott, Murphy & Presser, PC

(57) ABSTRACT

A proximity sensor includes a sensor cable that includes a first electrode wire and a second electrode wire arranged parallel to each other, an insulation covering both the first electrode wire and the second electrode wire, and a shield partially covering a surface of the insulation so as to form an opening, the first electrode wire and the second electrode wire being arranged to have different distances to the opening, and a detector circuit that includes a first capacitance detecting portion for detecting a first capacitance to be detected by the first electrode wire, a second capacitance detecting portion for detecting a second capacitance to be detected by the second electrode wire, and a differential output portion for outputting a difference between the first capacitance and the second capacitance.

6 Claims, 4 Drawing Sheets

(56) References Cited

U.S. PATENT DOCUMENTS

| | | | |
|---|---|---|---|
| 2014/0253151 A1* | 9/2014 | Kandler | B62D 1/046 |
| | | | 324/686 |
| 2015/0369941 A1* | 12/2015 | Pribisic | G01R 27/02 |
| | | | 324/658 |
| 2018/0216969 A1* | 8/2018 | Ikeda | G01D 5/2417 |

* cited by examiner

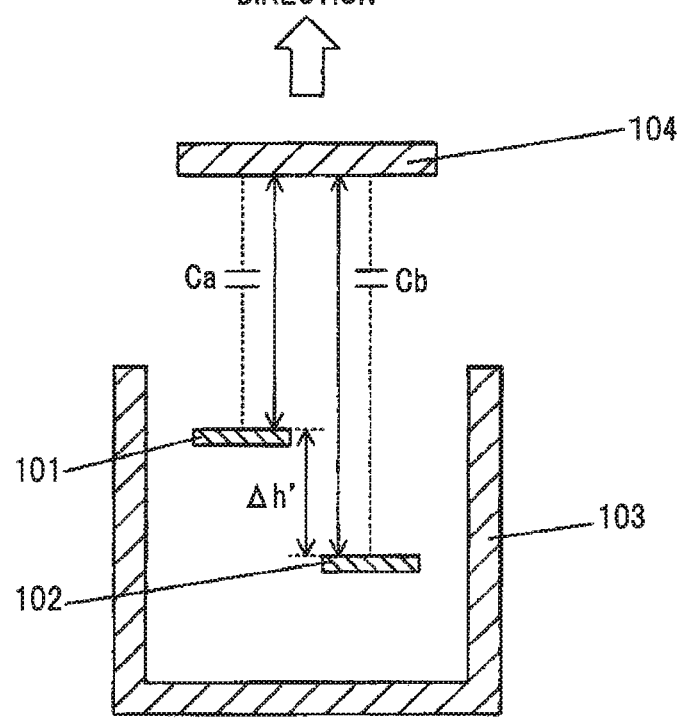

PROXIMITY SENSOR

The present application is based on Japanese patent application No. 2017-086975 filed on Apr. 26, 2017, the entire contents of which are incorporated herein by reference.

BACKGROUND OF THE INVENTION

1. Field of the Invention

The invention relates to a proximity sensor for sensing the proximity of an object.

2. Description of the Related Art

A capacitive proximity sensor which detects a change in capacitance is known. The capacitive proximity sensor detects a change in capacitance caused by an object such as human body (e.g., finger) and thereby senses the proximity of the object.

FIG. 5 shows a proximity sensor 100 disclosed in Japanese patent No. 4578980. The proximity sensor 100 has a first detection electrode 101, a second detection electrode 102, and a shield electrode 103. The first detection electrode 101 and the second detection electrode 102 are arranged so that there is a predetermined distance difference Δh' in a detection direction, and the shield electrode 103 surrounds the first and second detection electrodes 101 and 102 to selectively shield sides thereof except the detection direction.

When an object (detection target) 104 comes close, the proximity sensor 100 detects capacitances Ca and Cb generated between the object 104 and the first and second detection electrodes 101 and 102 and senses the proximity of the object based on a difference between the capacitances Ca and Cb. Since a change in capacitance due to airborne objects such as rain drops or fog occurs in the same way in both the first detection electrode 101 and the second detection electrode 102, erroneous detection due to airborne objects such as rain drops or fog can be prevented by performing detection of the proximity based on a difference between capacitances.

SUMMARY OF THE INVENTION

The proximity sensor 100 is configured such that the first and second detection electrodes 101 and 102 and the shield electrode 103 are all independent of each other to detect the capacitances Ca and Cb. In other words, these electrodes are not in contact with each other and electrical insulation therebetween is maintained. However, to maintain electrical insulation between the first and second detection electrodes 101 and 102 and the shield electrode 103, it is necessary to separate the electrodes from each other by, e.g., providing a spacer therebetween. Therefore, the conventional proximity sensor 100 is complicated to manufacture and is not good in mass productivity. Particularly long proximity sensors and thin proximity sensors are not easy to manufacture and are poorer in mass productivity.

It is an object of the invention to provide a proximity sensor that is excellent in mass productivity while preventing erroneous detection due to airborne objects such as rain drops or fog.

According to an embodiment of the invention, a proximity sensor comprises:

a sensor cable that comprises a first electrode wire and a second electrode wire arranged parallel to each other, an insulation covering both the first electrode wire and the second electrode wire, and a shield partially covering a surface of the insulation so as to form an opening, the first electrode wire and the second electrode wire being arranged to have different distances to the opening; and a detector circuit that comprises a first capacitance detecting portion for detecting a first capacitance to be detected by the first electrode wire, a second capacitance detecting portion for detecting a second capacitance to be detected by the second electrode wire, and a differential output portion for outputting a difference between the first capacitance and the second capacitance.

Effects of the Invention

According to an embodiment of the invention, a proximity sensor can be provided that is excellent in mass productivity while preventing erroneous detection due to airborne objects such as rain drops or fog.

BRIEF DESCRIPTION OF THE DRAWINGS

Next, the present invention will be explained in more detail in conjunction with appended drawings, wherein:

FIGS. 4A and 4B show another example of the shield in the embodiment of the invention, wherein FIG. 4A is a plan view of the shield and FIG. 4B is a plan view when the shield is spirally wound; and FIG. 5 is a schematic diagram illustrating a conventional proximity sensor.

DETAILED DESCRIPTION OF THE PREFERRED EMBODIMENTS

Embodiment

Figure 1:
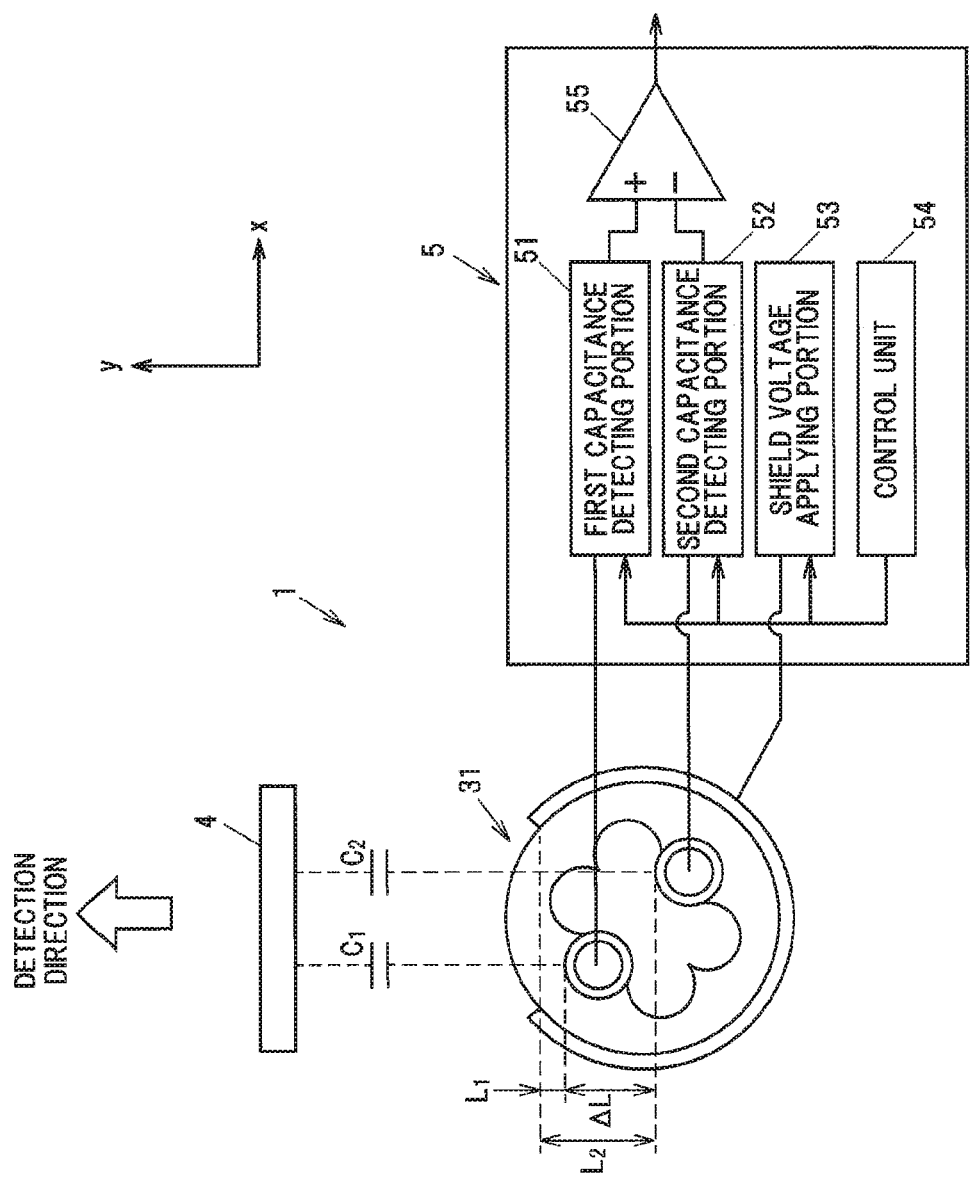
FIG. 1 is a schematic diagram illustrating a proximity sensor in an embodiment of the present invention.
Figure 2:
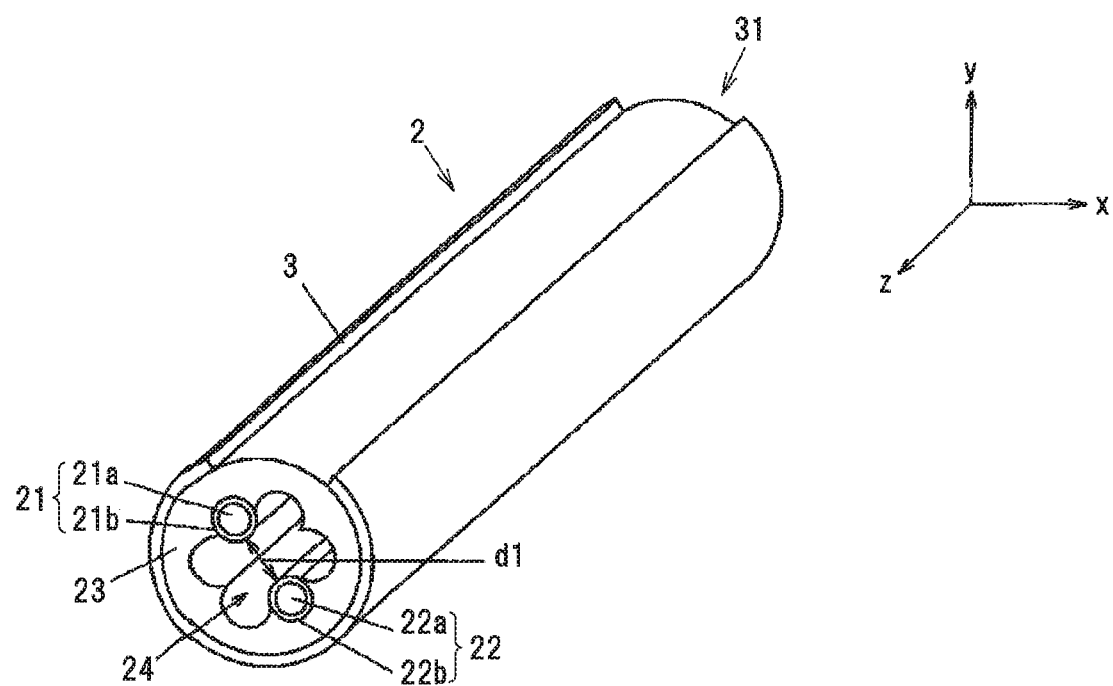
FIG. 2 is a perspective view showing the proximity sensor in the embodiment of the invention.

FIG. 1 is a schematic diagram illustrating a proximity sensor 1 in an embodiment of the invention, and FIG. 2 is a perspective view showing the proximity sensor 1 in the embodiment of the invention.

As shown in FIG. 1, the proximity sensor 1 in the embodiment of the invention is composed of a sensor cable 2 and a detector circuit 5. The sensor cable 2 has a first electrode wire 21 and a second electrode wire 22 which are arranged in parallel, an insulation 23 covering both the first electrode wire 21 and the second electrode wire 22, and a shield 3 partially covering the surface of the insulation 23 so that an opening 31 is formed, and the first electrode wire 21 and the second electrode wire 22 are arranged to have different distances to the opening 31, with a difference ΔL. Meanwhile, the detector circuit 5 has a first capacitance detecting portion 51 for detecting a first capacitance C1 to be detected by the first electrode wire 21, a second capacitance detecting portion 52 for detecting a second capacitance C2 to be detected by the second electrode wire 22, and a differential output portion 55 for outputting a difference between the first capacitance C1 and the second capacitance C2. The proximity sensor 1 senses the proximity of a detection target 4 based on a difference between the capacitance C1 and the capacitance C2. The proximity sensor 1 in the embodiment of the invention can be used as, e.g., a sensing device which is attached to a power-operated opening and closing member such as power-operated door of car or railway vehicle and detects pinching of human body, etc.

Sensor Cable 2

The sensor cable 2 is provided with the first and second electrode wires 21 and 22, the insulation 23 and the shield 3. The first electrode wire 21 and the second electrode wire 22 are arranged in parallel along a longitudinal direction (a z-axis direction in FIG. 2) without being twisted. The first electrode wire 21 and the second electrode wire 22 are spaced apart from each other and a fixed gap d1 is formed therebetween. The fixed gap d1 here means a shortest distance connecting between the surface of the first electrode wire 21 and the surface of the second electrode wire 22.

The first electrode wire 21 has a first conductive wire 21a formed of a metal and a first conductive layer 21b covering the first conductive wire 21a, and the second electrode wire 22 has a second conductive wire 22a formed of a metal and a second conductive layer 22b covering the second conductive wire 22a. The first conductive wire 21a and the second conductive wire 22a are, e.g., silver-plated soft copper twisted wires of 26 to 30 AWG. The first conductive layer 21b and the second conductive layer 22b are formed of a conductive rubber or a conductive plastic, and can be formed of, e.g., a mixture of EPDM (ethylene propylene diene) rubber or silicone rubber and a conductive filler. It is also possible to use a mixture of thermoplastic elastomer (e.g., styrene-based thermoplastic elastomer) and a conductive filler such as carbon black to form the first conductive layer 21b and the second conductive layer 22b. When using thermoplastic elastomer, any cross-linking process is not required at the time of molding and it is thus possible to simplify the process of forming the conductive layers 21b and 22b and to reduce the manufacturing cost.

The insulation 23 is formed to cover both the first and second electrode wires 21 and 22. The positions of the first electrode wire 21 and the second electrode wire 22 in a parallel state to each other are fixed by the insulation 23. That is, the fixed gap d1 is formed between the first electrode wire 21 and the second electrode wire 22.

The shield 3 covers the surface of the insulation 23 except the detection direction and thus has the opening 31 which opens in the detection direction of the proximity sensor 1 (a y-axis direction in FIG. 1). The shield 3 is formed by longitudinally wrapping a belt-shaped metal foil around the insulation 23 along a longitudinal direction of the insulation 23. The width of the belt-shaped metal foil is smaller than a circumference of the insulation 23 and is set according to a required size of the opening 31. As the metal foil, it is possible to use copper foil or aluminum foil. Optionally, a cover such as sheath may be further provided around the shield 3.

Figure 3:
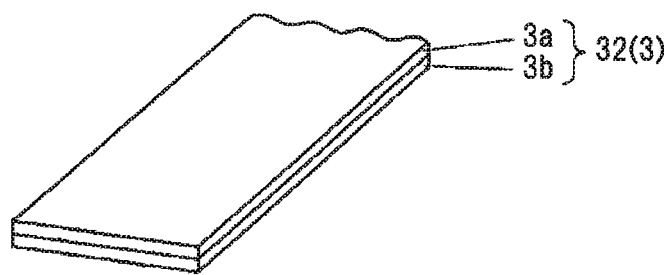
FIG. 3 is a perspective view showing an example of a shield in the embodiment of the invention.

As the shield 3, it is possible to use a composite tape 32 with a laminated structure of a base 3a formed of an insulating resin and a metal layer 3b formed of a conductive metal, as shown in FIG. 3. The base 3a can be formed of, e.g., a flexible resin such as polyester. The metal layer 3b can be formed of copper or aluminum. When using the composite tape 32, the composite tape 32 is longitudinally wrapped around the insulation 23 with the base 3a facing inward and the metal layer 3b facing outward so that a shield voltage applying portion 53 (described later) can be connected easily.

Figure 4A:
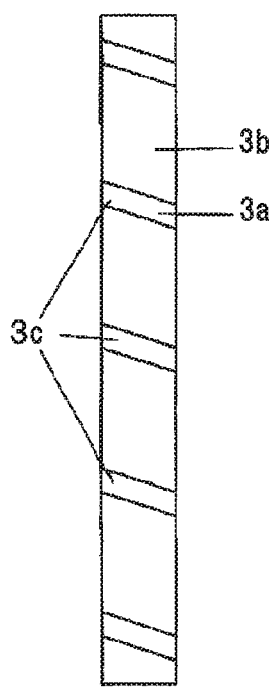
Figure 4B:
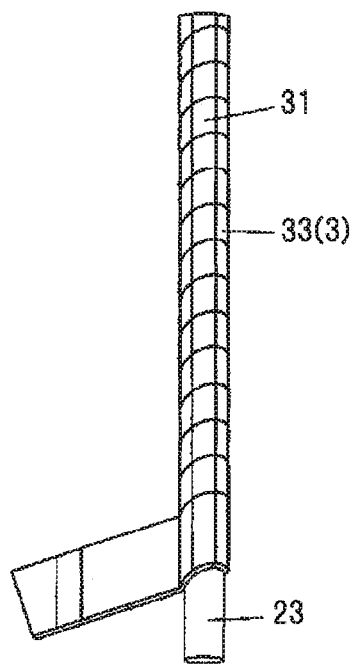

As the shield 3, it is also possible to use a composite tape 33 with diagonal slits 3c provided on the metal layer 3b at predetermined intervals, as shown FIG. 4. When the composite tape 33 is spirally wound around the insulation 23, the slits 3c are lined up in a row along the longitudinal direction of the sensor cable and form the opening 31. The width, angle and interval, etc., of the slits 3c are set according to the width and winding pitch of the composite tape 33. The sensor cable 2 is pliable since the composite tape 33 is spirally wound. As a result, it is easy to handle the sensor cable 2 and also it is possible to reduce damage on the shield 3 when transporting or installing the sensor cable 2.

In the present embodiment, a hollow portion 24 is formed between the first electrode wire 21 and the second electrode wire 22. The surface of the first electrode wire 21 at the position facing the second electrode wire 22 is exposed due to the hollow portion 24, and the surface of the second electrode wire 22 at the position facing first electrode wire 21 is exposed due to the hollow portion 24. In other words, facing surfaces of the first conductive layer 21b and the second conductive layer 22b are exposed due to the hollow portion 24.

Since the hollow portion 24 is formed, the first electrode wire 21 and the second electrode wire 22 come into contact with each other and are electrically conducted to each other when the detection target 4 comes into contact with the sensor cable 2 and the sensor cable 2 is thereby deformed. By detecting the electrical conduction, it is possible to sense contact of the detection target 4 with the sensor cable 2. Thus, besides the function of the proximity sensor (i.e., non-contact sensor), a function of touch sensor is added by forming the hollow portion 24.

Detector Circuit 5 and Detection Method

As shown in FIG. 1, the detector circuit 5 is connected to the proximity sensor 1. The detector circuit 5 is provided with the first capacitance detecting portion 51 for detecting the capacitance C1 between the first electrode wire 21 and the detection target 4, the second capacitance detecting portion 52 for detecting the capacitance C2 between the second electrode wire 22 and the detection target 4, the shield voltage applying portion 53 for applying shield voltage so that the shield 3 has the same electric potential as the first electrode wire 21 and the second electrode wire 22, a control unit 54 for synchronizing the timing of detecting capacitances by the first capacitance detecting portion 51 and the second capacitance detecting portion 52 with the timing of applying shield voltage to the shield 3 by the shield voltage applying portion 53, and the differential output portion 55 for outputting a difference between the capacitance C1 and the capacitance C2.

Firstly, the shield voltage applying portion 53 applies shield voltage to the shield 3 so that the shield 3 has the same electric potential as the first electrode wire 21, and in this state, the first capacitance detecting portion 51 detects the capacitance C1. Next, the shield voltage applying portion 53 applies shield voltage to the shield 3 so that the shield 3 has the same electric potential as the second electrode wire 22, and in this state, the second capacitance detecting portion 52 detects the capacitance C2. These operations are controlled by the control unit 54. Then, the differential output portion 55 outputs a difference $\Delta C$ between the capacitances C1 and C2. The proximity of the detection target 4 is determined based on the magnitude of the output $\Delta C$. For example, using a preset threshold, it is determined that the detection target 4 is not close when $\Delta C$ is smaller than the threshold, and it is determined that the detection target 4 is close when $\Delta C$ is greater than the threshold. A means for storing the threshold or a means for comparing $\Delta C$ with the threshold can be provided in another circuit (e.g., ECU (Engine Control Unit)) which is provided separately from the detector circuit 5.

Example

Example of the sensor cable 2 shown in FIG. 2 will be described below.

(1) First Electrode Wire 21 and Second Electrode Wire 22

The first conductive wire 21a and the second conductive wire 22a are prepared which are constructed from silver-plated soft copper twisted wires and have an outer diameter of 0.3 mm (28 AWG). Then, the surfaces of the first conductive wire 21a and the second conductive wire 22a are covered with the first conductive layer 21b and the second conductive layer 22b which are formed of a conductive rubber. The first conductive layer 21b and the second conductive layer 22b are formed of a mixture of EPDM and carbon black, of which conductivity is adjusted to 58 Ω·cm. The first electrode wire 21 and the second electrode wire 22 are 0.77 mm in outer diameter.

(2) Insulation 23

In addition to the first conductive wire 21a and the second conductive wire 22a, wire-shaped spacers (not shown) are also prepared. The spacers are provided to form the hollow portion 24 and are not required when the hollow portion 24 is not formed. As an alternative method of forming the hollow portion 24 without using the spacers, a die having a special shape may be used to extrude the insulation 23.

Firstly, a 0.1 mm-diameter spacer is arranged at the center. Then, two 0.77 mm-diameter spacers, the first conductive wire 21a, another two 0.77 mm-diameter spacers and the second conductive wire 22a are arranged in this order to surround the 0.1 mm-diameter spacer. The spacer is formed of an ethylene tetrafluoroethylene (ETFE)-coated wire. Next, the insulation 23 formed of TPE (thermoplastic elastomer) is extruded to cover the first conductive wire 21a, the second conductive wire 22a and the spacers which are held so that any gaps are not formed.

(3) Shield 3

Next, the shield 3 is provided around the insulation 23. The shield 3 used here is the composite tape 32 with a laminated structure of the base 3a formed of polyester and the metal layer 3b formed of copper as shown in FIG. 3, and is longitudinally wrapped around the insulation 23 along the longitudinal direction of the insulation 23. At this time, the shield 3 is attached so that the first electrode wire 21 and the second electrode wire 22 have different distances to the opening 31, with a difference ΔL. The width of the composite tape 32 is 8.0 mm, the thickness of the base 3a is 6.0 µm, and the thickness of the metal layer 3b is 9.0 µm.

(4) Hollow Portion 24

The sensor cable 2 (including the spacers) made as described above is cut into 1100 mm pieces, and each sensor cable 2 is completed by pulling out the five spacers. When pulling out the spacers, air may be injected between the insulation 23 and the spacers to facilitate pulling out of the spacers. In this regard, since the first and second conductive wires 21a and 22a and the spacers are not twisted, the spacers can be pulled out easily.

Lastly, the detector circuit 5 is connected to the first electrode wire 21, the second electrode wire 22 and the shield 3 at an end portion of the sensor cable 2, and the proximity sensor 1 is thereby obtained.

When the obtained proximity sensor 1 was tested, it was confirmed that the detectable position was 1 mm. The detectable position can be adjusted by adjusting the threshold.

Functions and Effects of the Embodiment

As described above, the proximity sensor 1 in the embodiment of the invention is provided with a sensor cable, which has the first electrode wire 21 and the second electrode wire 22 arranged parallel to each other, the insulation 23 covering both the first electrode wire 21 and the second electrode wire 22, and the shield 3 partially covering the surface of the insulation 23 so as to have the opening 31 and in which the first electrode wire 21 and the second electrode wire 22 are arranged to have different distances to the opening 31 with a difference ΔL, and a detector circuit which has the first capacitance detecting portion 51 for detecting the first capacitance C1 to be detected by the first electrode wire 21, the second capacitance detecting portion 52 for detecting the second capacitance C2 to be detected by the second electrode wire 22, and the differential output portion 55 for outputting a difference between the first capacitance C1 and the second capacitance C2.

In this configuration, the first electrode wire 21 and the second electrode wire 22 are maintained in parallel to each other in the sensor cable 2 by being covered with the insulation 23. In addition, the proximity sensor 1 except the detector circuit 5 can be manufactured only by arranging the shield 3 around the insulation 23 so that the there is a difference ΔL in distance to the opening 31 of the shield 3 between the first electrode wire 21 and the second electrode wire 22. Such sensor cable 2 can be manufactured by a cable manufacturing process. Therefore, according to the invention, it is possible to realize the proximity sensor 1 excellent in mass productivity. In addition, since the cable manufacturing process is used to manufacture the sensor cable 2, it is possible to easily manufacture long cables of several hundred meters or thin cables of not more than 10 mm in diameter.

In addition, since the proximity of the detection target 4 is sensed based on a difference between the first capacitance C1 detected by the first electrode wire 21 and the second capacitance C2 detected by the second electrode wire 22, it is possible to prevent erroneous detection due to airborne objects such as rain drops or fog.

Although the embodiment of the invention has been described, the invention according to claims is not to be limited to the embodiment. Further, please note that all combinations of the features described in the embodiment are not necessary to solve the problem of the invention. The invention can be appropriately modified and implemented without departing from the gist of the invention.

The invention claimed is:

1. A proximity sensor, comprising:
   a sensor cable that comprises a first electrode wire and a second electrode wire arranged parallel to each other, an insulation covering both the first electrode wire and the second electrode wire, and a shield partially covering a surface of the insulation so as to form an opening, the shield comprising a composite tape formed by laminating a base comprising an insulating resin and a metal layer comprising a conductive metal, the first electrode wire and the second electrode wire being arranged to have different distances to the opening; and
   a detector circuit that comprises a first capacitance detecting portion for detecting a first capacitance to be detected by the first electrode wire, a second capacitance detecting portion for detecting a second capacitance to be detected by the second electrode wire, and a differential output portion for outputting a difference between the first capacitance and the second capacitance;

wherein a plurality of slits are formed on the metal layer of the composite tape at predetermined intervals, and the composite tape is spirally wound around the sensor cable so that the plurality of slits are lined up along the longitudinal direction of the sensor cable and form an opening.

2. The proximity sensor according to claim 1, wherein the insulation comprises a hollow portion formed between the first electrode wire and the second electrode wire.

3. The proximity sensor according to claim 2, wherein each of the first and the second electrode wire comprises a conductive wire comprising a metal and a conductive layer comprising a conductive rubber or a conductive plastic and covering the conductive wire.

4. The proximity sensor according to claim 2, wherein the shield comprises a composite tape formed by laminating a base comprising an insulating resin and a metal layer comprising a conductive metal.

5. The proximity sensor according to claim 1, wherein each of the first and the second electrode wire comprises a conductive wire comprising a metal and a conductive layer comprising a conductive rubber or a conductive plastic and covering the conductive wire.

6. The proximity sensor according to claim 5, wherein the shield comprises a composite tape formed by laminating a base comprising an insulating resin and a metal layer comprising a conductive metal.

* * * * *